(12) United States Patent
Holme et al.

(10) Patent No.: US 9,935,208 B2
(45) Date of Patent: Apr. 3, 2018

(54) ENERGY STORAGE DEVICE WITH LARGE CHARGE SEPARATION

(71) Applicant: The Board of Trustees of the Leland Stanford Junior University, Palo Alto, CA (US)

(72) Inventors: Timothy P. Holme, Mountain View, CA (US); Friedrich B. Prinz, Woodside, CA (US); Andrei T. Iancu, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 15/060,239

(22) Filed: Mar. 3, 2016

(65) Prior Publication Data

US 2016/0204281 A1    Jul. 14, 2016

Related U.S. Application Data

(62) Division of application No. 13/135,798, filed on Jul. 13, 2011, now Pat. No. 9,312,398.

(60) Provisional application No. 61/399,574, filed on Jul. 13, 2010, provisional application No. 61/399,757, filed on Jul. 15, 2010, provisional application No. 61/520,960, filed on Jun. 17, 2011.

(51) Int. Cl.
H01L 29/92 (2006.01)
H01L 33/00 (2010.01)
H01G 7/06 (2006.01)

(52) U.S. Cl.
CPC .............. *H01L 29/92* (2013.01); *H01G 7/06* (2013.01); *H01L 33/0008* (2013.01); *Y02T 10/7022* (2013.01)

(58) Field of Classification Search
None
See application file for complete search history.

(56) References Cited

U.S. PATENT DOCUMENTS 8,867,261 B2 * 10/2014 Meade ................. G11C 11/565
365/145
2012/0156545 A1 * 6/2012 Holme .................... H01G 9/02
429/144

* cited by examiner

*Primary Examiner* — Michelle Mandala
(74) *Attorney, Agent, or Firm* — Lumen Patent Firm

(57) ABSTRACT

High density energy storage in semiconductor devices is provided. There are two main aspects of the present approach. The first aspect is to provide high density energy storage in semiconductor devices based on formation of a plasma in the semiconductor. The second aspect is to provide high density energy storage based on charge separation in a p-n junction.

9 Claims, 10 Drawing Sheets

ENERGY STORAGE DEVICE WITH LARGE CHARGE SEPARATION

CROSS REFERENCE TO RELATED APPLICATIONS

This application is a divisional of U.S. application Ser. No. 13/135,798, filed Jul. 13, 2011, and hereby incorporated by reference in its entirety. Application Ser. No. 13/135,798 claims the benefit of U.S. provisional patent application 61/399,574, filed on Jul. 13, 2010, entitled "Energy Storage Device with Large Charge Separation in Structures Containing PN Junctions", and hereby incorporated by reference in its entirety. Application Ser. No. 13/135,798 also claims the benefit of U.S. provisional patent application 61/399,757, filed on Jul. 15, 2010, entitled "Multiple Exciton Generation and Storage in an Energy Storage Device with a Narrow Bandgap Semiconductor", and hereby incorporated by reference in its entirety. Application Ser. No. 13/135,798 also claims the benefit of U.S. provisional patent application 61/520,960, filed on Jun. 17, 2011, entitled "All Electron Battery with an Electron Plasma for Charge Storage and Permittivity", and hereby incorporated by reference in its entirety.

GOVERNMENT SPONSORSHIP

This invention was made with Government support under contract number W911NF-07-2-0027 awarded by the US Army Research Laboratory, and under contract DE-AR0000069 awarded by ARPA-E under the Department of Energy. The Government has certain rights in this invention.

FIELD OF THE INVENTION

This invention relates to energy storage.

BACKGROUND

Energy storage is a crucial component of a large number and variety of electronic devices, particularly for mobile devices and electric or hybrid vehicles. Energy storage devices have been based on a wide variety of physical effects. For example, electric fields can be employed to store energy in capacitors, and chemical reactions (involving ion motion) can be employed to store energy in batteries. However, energy storage in a capacitor can be limited by the device geometry (e.g., 2-D capacitor plates having limited area), and batteries can have a slow response time due to the ion motion inherent in electrochemical reactions.

Battery powered devices such as hybrid or electric vehicles are often limited in performance by the low energy stored per weight in batteries. Batteries have low storage density due to the low voltage produced by electrochemical reactions and the large size and weight of the ions stored in the batteries. Slow ion transport in batteries also causes slow charge and discharge performance. Furthermore, the reliance of existing batteries on ionic transport causes high degradation rates of the batteries.

Accordingly, it would be an advance in the art to provide energy storage having higher energy density than a capacitor, faster charge/discharge than a battery and/or much longer lifetime than a battery.

SUMMARY

In the present work, high density energy storage is provided in semiconductor devices. There are two main aspects of the present approach. The first aspect is to provide high density energy storage in semiconductor devices based on formation of a plasma in the semiconductor. The second aspect is to provide high density energy storage based on charge separation in a p-n junction.

In one embodiment, a plasma based device includes at least one semiconductor layer with a low bandgap, at least one barrier layer with high breakdown field strength (and high resistivity and bandgap), and an anode and cathode. A strong electrical field, nearly as high as the breakdown voltage in the barrier layer, is applied between the anode and cathode, polarizing the material in between. The low bandgap semiconductor becomes polarized as the electric field separates electrons and holes in the material by direct excitation by the E-field across the bandgap.

If the polarization is large enough and very high charge density is obtained, an electron and/or hole plasma may form. In the plasma, the screening length increases with the charge density, thereby reducing the repulsion between the charges, allowing the charge density to be further increased. At the same time, the permittivity of the plasma increases, and may reach very high values (>10^4) if the charge density is high and the length scale over which the charge density is nearly uniform is large (>10 nm). Uniform planar layers may be fabricated over distances of >>100 nm, so uniformity of charge distribution over large areas may be achievable with thin film processing. Further, the density of states of the semiconductor may be engineered to allow a group velocity that is advantageous to plasma formation. By realizing a device with high permittivity and high charge concentration, the device will achieve very high energy density. For the plasma approach, semiconducting materials are generally narrow-bandgap semiconductors (bandgap preferably less than 1.0 eV, more preferably less than 0.3 eV), for example, PbS, PbSe, InSb, InAs, PbTe, GaSb, and $Hg_xCd_{1-x}Te$.

Together with polarization in the semiconductor, there may be charge injection from the electrodes into the low bandgap regions. This may further increase the charge density, thereby increasing energy storage. Low cost may be obtained since most of the volume of the device (the thick semiconductor layer(s)) does not have to be deposited with high quality. To obtain high $E_{bd}$ values, the barrier material may be required to be of high quality.

In a second aspect, charge separation in a p-n junction is exploited to provide energy storage. This approach creates a large polarization of a material in response to applying a voltage across electrodes on either side of the material. Instead of a dielectric material, the present approach uses one or many layers of p-n junctions, surrounded on at least one side by a wide-bandgap insulating material. For the p-n junction approach, p and n materials are generally wide-bandgap semiconductors (bandgap preferably greater than 0.5 eV, more preferably greater than 1.5 eV) with a charge carrier density of at least $10^{10}/cm^3$, for example, Si, Ge, GaAs, InP, InAs, $TiO_2$, ZnO, and ZnS. The insulating material generally has a high breakdown voltage, and high resistivity, and a wide bandgap. Materials such as $Al_2O_3$, $SiO_2$, or $HfO_2$ are suitable for the insulating material.

The energy density of a capacitor with a relative dielectric constant epsilon and breakdown field strength of $E_{BD}$ is given by ½*epsilon*epsilon_0*$E_{BD}^2$, if epsilon is a constant independent of the electric field, where epsilon_0 is the permittivity of free space. According to the present approach, to achieve a high epsilon, and therefore a high energy density, the polarizability of the material is generally high. That is, an applied electric field will cause a large number of charges to separate over large distances.

If epsilon is not a constant with electric field (i.e. $\epsilon=\epsilon(E)$), the energy density of a capacitor is given by $$\int_0^{E_{bd}} \varepsilon(E)EdE.$$

Therefore, a dielectric including a material with a permittivity that increases with field will store additional energy compared to a material with a lower and constant permittivity. Aspects of the present approach embody methods to create a material that behaves as a dielectric with a permittivity that increases with applied field, in contrast to naturally occurring insulators, which have a permittivity which is constant or decreasing as field strength increases.

According to principles of the invention, when an electric field is applied across the electrodes, the carriers flow in response, separating over relatively large distances that are comparable to the thickness of the p+n layers. Therefore, a large polarizability and high energy density is provided. A high charge carrier mobility in the p and n layers is preferred to achieve a large charge displacement in response to an electric field. Accordingly, the semiconductor layers should have high mobility, preferably above $10^{-4}$ cm$^2$/Vs. Several methods to measure carrier mobility are known, including Hall effect measurements, and field-effect mobility measurements in the saturation and/or linear regions. Explicitly, carrier mobility may be determined by doing a Hall effect measurement and finding the mobility $\mu=-\sigma_n*R_{Hn}$, where $\sigma_n$ is the electron conductivity, which is tabulated or measured, and $R_{Hn}$ is the electron Hall coefficient. Along with high mobility, the charge carriers should have a low effective mass so that they are more effectively accelerated by an electric field, giving a high polarizability. The charge carrier effective mass is preferably below 0.2 m$_e$, where m$_e$ is the mass of a free electron.

The availability of charge carriers is another important feature of the semiconductor materials to achieve high polarizability, therefore the carrier concentrations of the p and n materials should be high and approximately equal. An alternative means to achieve a high carrier concentration is to have a material Fermi level near the valence or conduction band level, or a doping level sufficient to have a carrier concentration preferably above $10^{19}$/cm$^3$, and even more preferably above $10^{21}$/cm$^3$. The carrier concentration can be measured, for example by optical means or by a Hall effect measurement.

Variations of the p-n junction approach can include devices where several layers of (ipn) are included in a row (e.g. electrode|ipn ipn i|electrode). In such devices, additional effects may occur across the insulator layers in the middle. Since they separate n and p layers with a layer of insulator that may be as thin as 1-10 nm, two interaction effects across that layer may occur. First, the interaction is attractive, since it occurs between charge carriers of different sign. This attractive interaction makes the polarization easier, and therefore increases the effective epsilon of the material. The thinner the insulator layer is, the greater the attractive interaction between electrons and holes on opposite sides of the insulator, and therefore the charge density on each side of the dielectric may be greater. The energy density is therefore increased since more charges may be stored at the same voltage in the device. An embodiment of the invention may include insulating layers of varying thicknesses throughout the device, such as a continually increasing insulator thickness (or a continually increasing insulator bandgap) throughout the device so that it becomes increasingly difficult for charge carriers to tunnel across the insulating regions, so that some charge tunneling is allowed near the electrodes but charges are eventually blocked from tunneling through the entire device, which would result in a device that is electrically shorted.

The second interaction effect across the insulator is when formation of excitons across the barrier occurs. When these excitons are kept for relatively long periods of time (larger than the recombination time scale), at low temperatures or high densities, a condensation may occur (Bose-Einstein condensation (BEC)). To improve the chance of BEC formation, the Bohr exciton radius of the semiconductor materials should be large, preferably over 5 nm, more preferably over 10 nm, and still more preferably over 15 nm. A further effect that may be employed to increase the chance of BEC formation is to apply a magnetic field perpendicular to the interface of the semiconductor materials. When the magnetic field has a strength such that the Landau levels are half-filled (an occupation of ½ electrons in one material and ½ holes in the other material), BEC formation is optimal.

Another embodiment has the insulating region replaced with a tunnel junction including heavily doped n+ and p+ regions as in a solar cell with tunnel junctions. The tunnel junctions provide a method to increase the voltage of a single device by effectively putting several devices in series. Electrons from one region may tunnel through the tunnel junction to combine with holes from the adjacent region. Therefore, a continuity of current is achieved while the voltage is stacked.

Diode p-n junctions in reverse bias have a junction capacitance due to carrier depletion at the interface. That capacitance, however, is decreasing with voltage, whereas the capacitance in structures of the present approach feature a capacitance that increases with voltage.

The present approach provides numerous advantages, and is widely applicable. Some of the advantages of embodiments of the invention include: low cost materials and fabrication compared to other energy storage approaches, higher energy density compared to capacitors, higher safety, durability, charge/discharge rate, lifetime, roundtrip efficiency, and/or power density compared to batteries.

Applications include energy storage for portable electronics, transportation, automotive, grid/utility scaled applications, and the like. Further, this invention may be useful for providing decoupling devices for integrated circuits.

DETAILED DESCRIPTION

A) Plasma Formation for Energy Storage

Figure 1A:
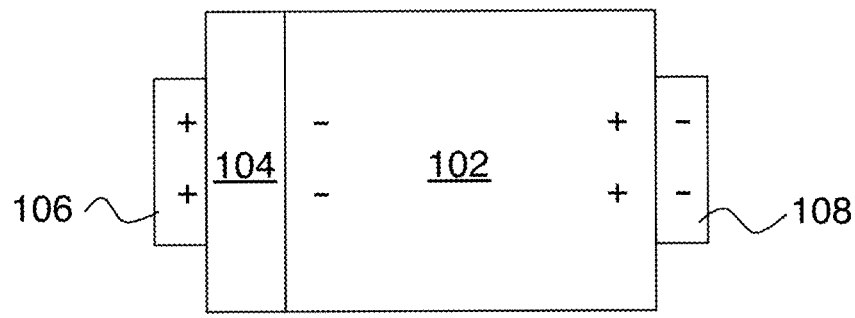
FIGS. 1a-c show examples of semiconductor plasma devices for storing energy.
Figure 1B:
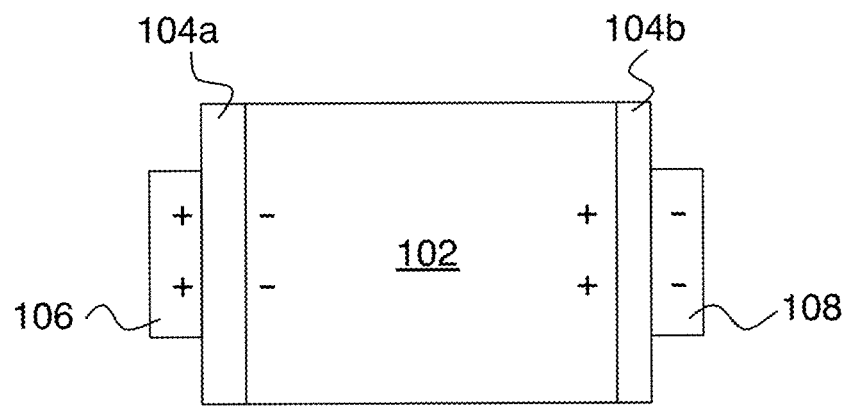
Figure 1C:
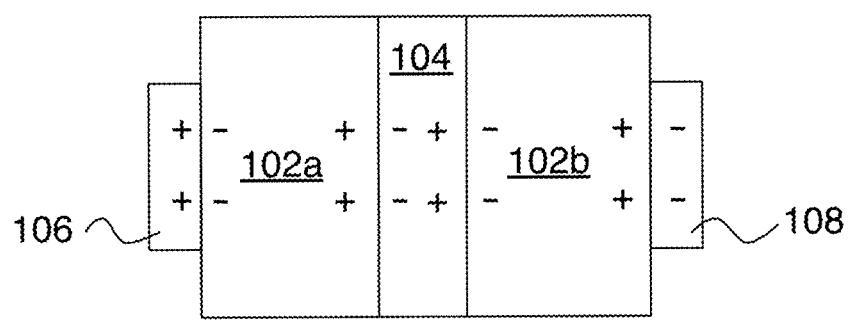

FIGS. 1*a-c* show examples of semiconductor plasma devices for storing energy. In the example of FIG. 1*a*, a first volume of active material 102 is disposed between conductive electrodes 106 and 108. Upon application of a voltage across the electrodes, one or both of an electron plasma or hole plasma is formed in the first volume of active material 102, according to above-described principles. The electron plasma and/or hole plasma independently have a density of charge carriers of greater than about 0.5 electron (or hole) per $nm^3$ when the material is subject to a field of 0.7 V/nm. Preferably, these carrier concentrations are higher (e.g., greater than about 1.0 electron (or hole) per $nm^3$).

Here and throughout this description, it is convenient to describe application of an electric field to a material in terms of the external variables of applied voltage and material thickness. Thus, an applied field of 0.7 V/nm can be obtained by providing 0.7 V across 1 nm of material, 0.35 V across 0.5 nm of material, etc. Typically, the electric field within a material that is subject to such an applied field will vary with position within the material, and this electric field may or may not equal the applied field at any point within the material. The voltage applied across the electrodes to form the plasma in the first volume of active material 102 produces an energy density of greater than about 1 Wh/L for the device.

Energy density may be measured by constant current charge-discharge measurements of the voltage as a function of charge state (galvanostatic measurement). In this measurement, a constant current of one polarity is applied while the voltage across the device increases to the maximum rated voltage, then the polarity of the current is reversed until the device voltage returns to zero. Energy density during charge is derived from the area under the curve of a plot of the charge versus voltage (charge q(t)=I(t)*dt) during the charging cycle, and energy density during discharge is calculated similarly during the discharge portion of the cycle. Alternatively, the energy density can be measured by applying a constant voltage ramp up to the maximum voltage and measuring the current, then applying a voltage ramp of the opposite polarity until voltage returns to zero and measuring the current. Again, energy=$\int q(V)dV=\int V(q)dq$.

Preferably, as shown on FIG. 1*a*, a volume of barrier material 104 is disposed between active volume 102 and an electrode. The composition and dimensions of barrier volume 104 are preferably selected such that there is a range of applied fields to the device such that a) an electron and/or hole plasma forms in active volume 102, and b) the electric field in barrier volume 104 is less than the breakdown field strength of the material of barrier volume 104. Preferably, the breakdown field strength of barrier volume 104 is greater than about 0.5 V/nm. Suitable materials for barrier layer 104 include but are not limited to: $SiO_2$, $Al_2O_3$, $HfO_2$, $Pr_2O_3$, nitrides, fluorides, diamond, Zr:$HfO_2$, SiON, Pb(ZrTi)$O_3$, and combinations thereof.

In the example of FIG. 1*a*, charge may be injected from electrode 108 into active volume 102. Charge injection is preferable if screening in the active volume is higher than screening in the electrode and/or if the barrier volumes can withstand a larger electric field. Charge injection into the active volume may be measured by investigation of optical properties of the active volume, such as transmission or absorption. In other cases, it may be desirable to prevent such charge injection, as in the example of FIG. 1*b*. Here active volume 102 is sandwiched between barrier volumes 104*a* and 104*b*. In this example, it is preferred for plasma to form in active volume 102 at an applied voltage to electrodes 106 and 108 that is sufficiently low that breakdown does not occur in barrier volumes 104*a* and 104*b*. More specifically, electric fields produced in barrier volumes 104*a* and 104*b* in response to the applied voltage are preferably below the breakdown field strengths of the materials of barrier volumes 104*a* and 104*b*. Preferably, the breakdown field strengths of barrier volumes 104*a* and 104*b* is greater than about 0.5 V/nm. Suitable materials for barrier layers 104*a* and 104*b* include but are not limited to: $SiO_2$, $Al_2O_3$, $HfO_2$, $Pr_2O_3$, nitrides, fluorides, and combinations thereof.

Preferably, active volume 102 is a semiconducting material, which preferably has a band-gap energy of less than about 1 eV (more preferably, a band-gap energy of less than about 0.3 eV). Preferably, the effective mass of the charge carriers in the electron-plasma or hole-plasma of active volume 102 is less than about 0.2 $m_e$, where $m_e$ is the electron mass. The effective mass may be measured by cyclotron resonance or band-structure measurements, where the electron effective mass is determined from the curvature of the conduction band. Preferably, active volume 102 has a dielectric constant of less than about 20. Suitable semiconducting materials for active volume 102 include, but are not limited to: PbS, PbSe, InSb, InAs, PbTe, GaSb and $Hg_xCd_{1-x}Te$. Of these materials, PbSe, InSb, $Hg_xCd_{1-x}Te$ and InAs are preferred, and InSb is particularly preferred at the present time.

Preferably, all linear dimensions of active volume 102 are greater than about the bohr radius of an exciton in the material of active volume 102. Other preferred embodiments have all linear dimensions of active volume 102 greater than about 100 nm. In some cases, active volume 102 is planar in shape and has a thickness of less than about 3 μm;

Multi-layer embodiments are also possible. For example, the combination of volumes 102 and 104 on FIG. 1*a* can be regarded as a unit cell, and this unit cell can be repeated one or more times between the electrodes to form a multi-layer structure. In such multi-layer structures, each of the active volumes may be the same material and/or different materials. Similarly, the compositions of the barrier volumes may be the same and/or different. The thicknesses of the semiconducting materials and barrier materials may be the same and/or different.

FIG. 1*c* shows an embodiment having two active volumes 102*a* and 102*b* sandwiching a barrier volume 104. Preferably, active volumes 102*a* and 102*b* of this example are as described above in connection with active volume 102 on FIG. 1*a*, and barrier volume 104 here is preferably as described above in connection with barrier volume 104 on FIG. 1*a*. In some preferred embodiments, the thickness of barrier volume 104 on FIG. 1*c* is greater than about 5 nm, resulting in a separation between active volumes 102*a* and 102*b* of greater than about 5 nm. In some embodiments, configurations as in FIG. 1*c* can have carrier injection from electrode 106 to active volume 102*a* and/or from electrode 108 to active volume 102*b* in response to an applied voltage at the electrodes. The Fermi levels of active volumes 102a and 102b can be the same or they can be different.

Any and all known semiconductor fabrication technology can be employed to fabricate plasma-based energy storage devices as described herein. For example, layers may be fabricated using thin film deposition techniques such as MBE, PLD, ALD, sputtering, CVD, MOCVD, chemical bath deposition, or a layer transfer process. Such fabrication is within the skill of an art worker, and is therefore not described in detail here.

Figure 2:
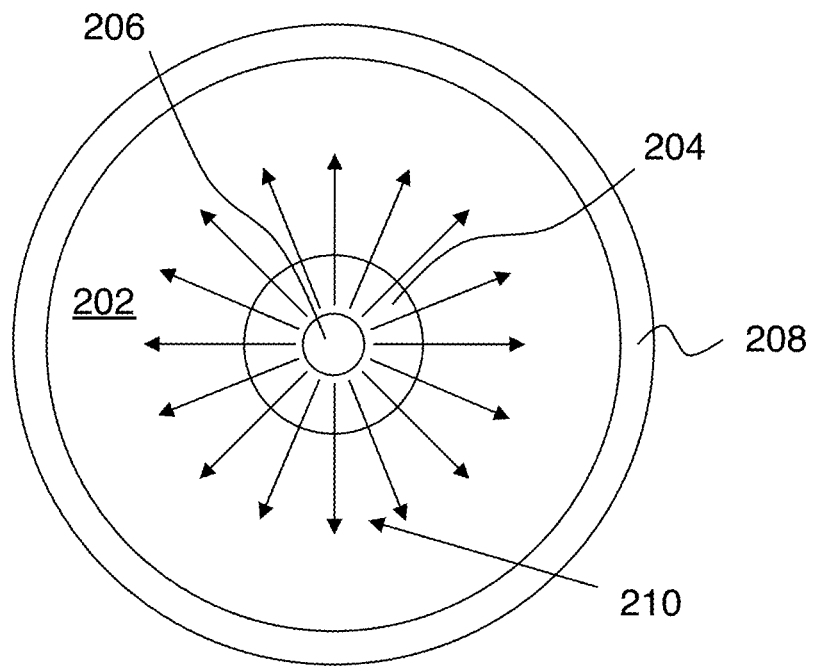
FIG. 2 shows an alternative geometry for a semiconductor plasma device.

FIG. 2 shows an alternative geometry for a semiconductor plasma device. In this example, electrode 208 is cylindrically shaped and encloses electrode 206. Between the electrodes, an active volume 202 and a barrier volume 204 are disposed. Preferably the active and barrier volumes of this example are as described above in connection with FIGS. 1a-c. An advantage of this approach is that electric field lines concentrate, as schematically shown by 210, which may assist with plasma formation.

Figure 3:
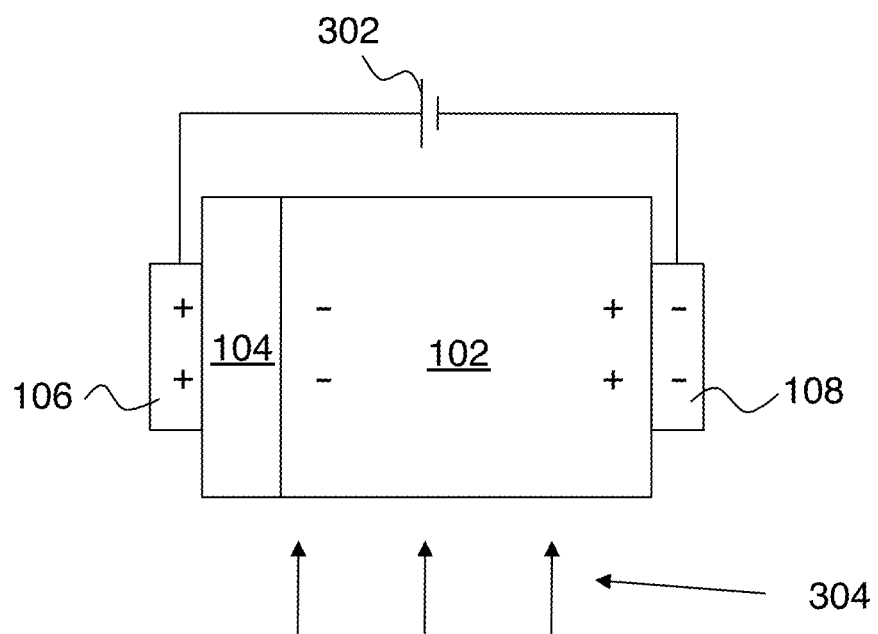
FIG. 3 shows an approach for charging a semiconductor plasma device.

FIG. 3 shows an approach for charging a semiconductor plasma device. In this example, a device as in FIG. 1a is charged by the combination of an applied voltage from a voltage source 302 and electromagnetic radiation 304. Preferably, the electromagnetic radiation has photon energy greater than the band gap energy of active volume 102. This approach may assist with carrier generation, and therefore plasma formation.

Screening of electrons in a plasma allows a larger charge density by reducing the repulsive force due to carrier-carrier interaction. One model for screening is given by $$V_s(r) = \frac{e^2}{\varepsilon_0 r} e^{-\kappa r}$$

where $V_s$ is the screened electrostatic potential energy, e is the electron charge, $\varepsilon_0$ is the permittivity of free space, $\kappa$ is the screening parameter, and r is distance. The screening parameter in 3-D is given by $$\kappa_{3D} = \sqrt{\frac{4\pi e^2}{\varepsilon_0} \frac{dn}{d\mu}}$$

where n is the carrier concentration and μ is the Fermi level (also known as the chemical potential). At sufficiently low temperatures, $\kappa_{3D}$ is approximately given by $$\kappa_{3Dapx} = \sqrt{\frac{6\pi e^2 n}{\varepsilon_0 E_f}}$$

where $E_f$ is the Fermi energy referenced to the vacuum potential. At room temperature, this approximation typically holds to several decimal places. In 2-D, the screening parameter is given by $$\kappa_{2D} = \frac{2me^2}{\varepsilon_0 \hbar^2} (1 - \exp(-\pi \hbar^2 n / mkT))$$

where m is the effective mass of the carriers.

Figure 4A:
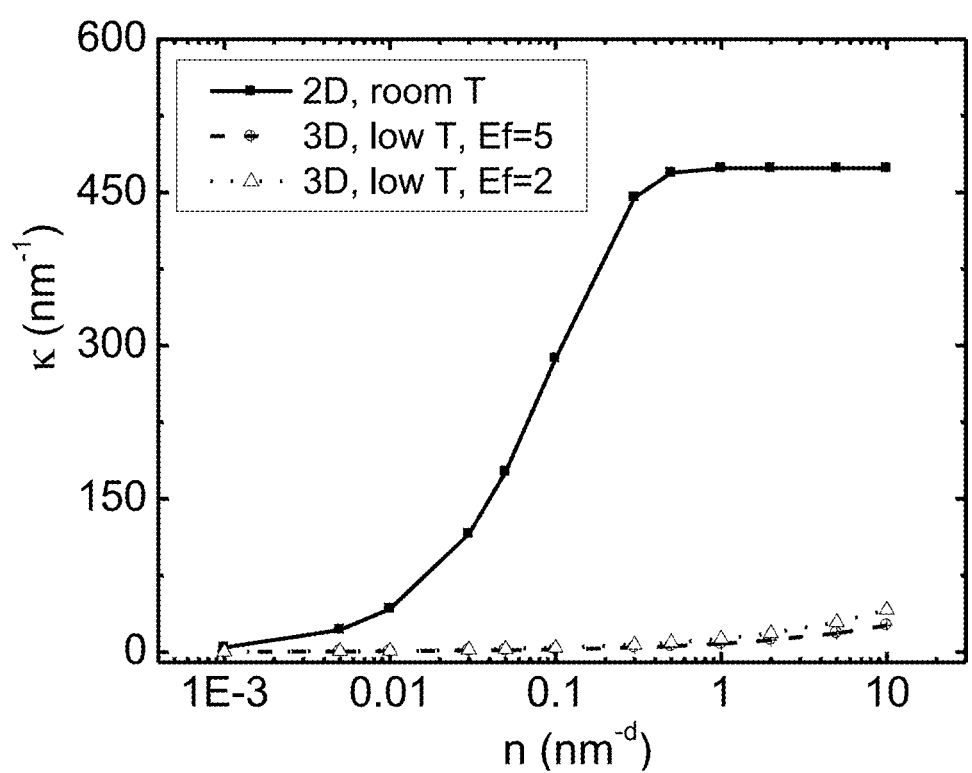
FIGS. 4a-c show calculated screening parameters and dielectric constants for a numerical example.

FIG. 4a shows some plots of the screening parameter vs. carrier concentration. The solid line shows calculated results for 2-D screening at room temperature. The dashed and dotted lines show $\kappa_{3Dapx}$ for two different values of Ef ($E_f$=5 eV for the dashed line and $E_f$=2 eV for the dotted line).

For a plasma, the dielectric constant is given by:

$$\varepsilon_{2D} = 1 + \frac{\kappa}{q}$$

$$\varepsilon_{3D} = 1 + \frac{\kappa^2}{q^2}$$

where $\varepsilon_{2D}$ is the dielectric constant for a 2-D plasma, $\varepsilon_{3D}$ is the dielectric constant for a 3-D plasma, κ is the screening parameter as described above, and q is the change in momentum experienced by an electron when a perturbation (in this case, the electric field) is applied ($q=k_f-k_i$). By engineering the density of states of the semiconductor material, one may select for a small q. One may engineer a material with a density of states high enough that states become degenerate and the momentum transfer on scattering is small, therefore the effective permittivity is high. The group velocity $v_g$ is found from the dispersion relation of the solid: $v_g=\partial\omega/\partial k$. Therefore, the group velocity goes to zero when states become degenerate and momentum transfer becomes small.

An interesting feature of the equation for the screening length $\kappa_{3D}$ above is that the screening length increases with n, the carrier density. Since the permittivity increases with the screening length, and the carrier density increases with the applied voltage, this results in an effective permittivity that increases as a function of the electric field. An increasing permittivity with field is advantageous for energy storage as discussed above and is not often found in naturally occurring materials and therefore is an attractive and distinguishing feature of the present approach.

The plasma theory developed above considers an electron gas subject to a perturbation. The solution is a ground state solution, meaning it is a stable state of the perturbed system, thus a long lifetime can be expected in the state, which is suitable for energy storage.

Figure 4B:
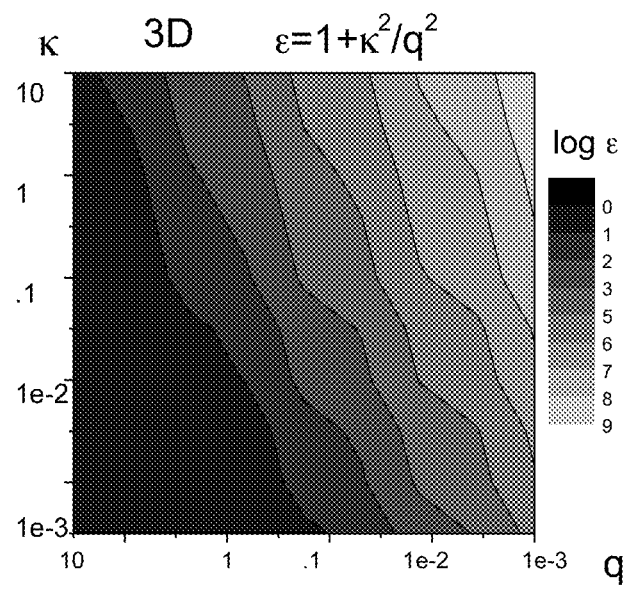
Figure 4C:
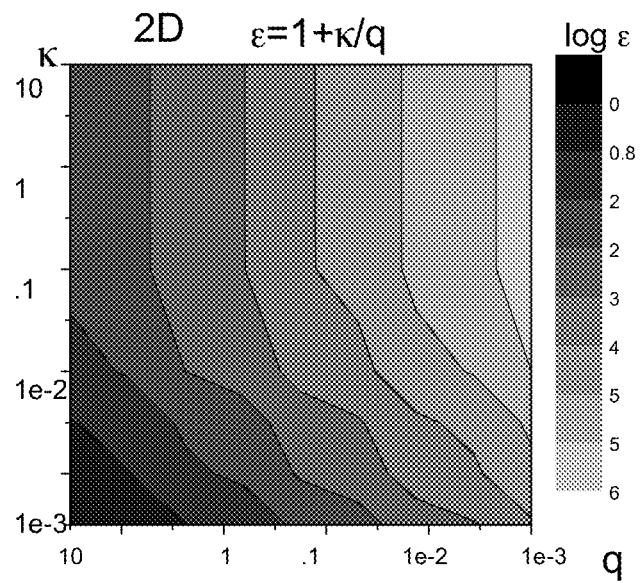

Since quantum wells in 2-D can be fabricated with homogeneity >100 nm, large areas may be fabricated with a high dielectric constant, and therefore energy storage. FIGS. 4b and 4c show calculated 3D and 2D dielectric constants, respectively, for various values of κ and q. With κ on the order of 1 nm$^{-1}$ and q on the order of 0.01 nm$^{-1}$, ε values over 100,000 should be possible for both 2D and 3D cases.

Figure 5:
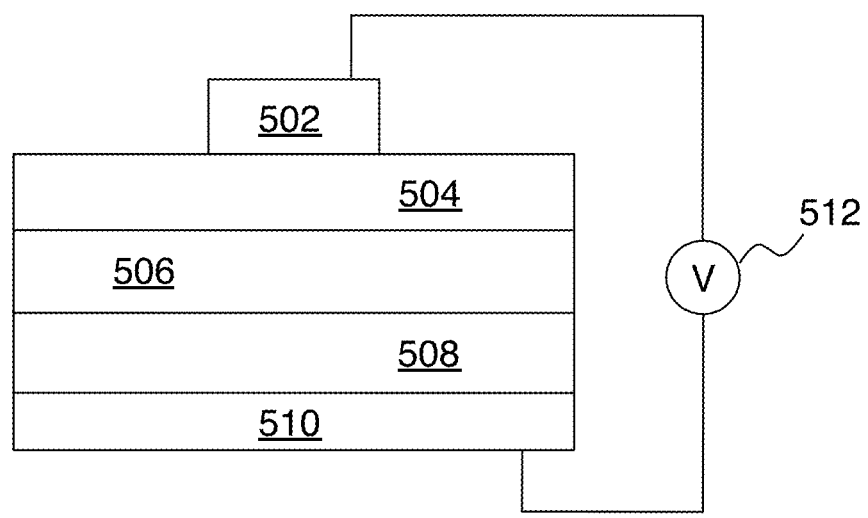
FIG. 5 shows the configuration of an experimental semiconductor device demonstrating enhanced energy storage.

FIG. 5 shows the configuration of an experimental semiconductor device demonstrating enhanced energy storage. In this example, the experimental device included an evaporated Al top electrode 502 (of diameter 1 mm), a 130 nm thick PbS layer 504 (fabricated by PLD), a 30 nm $Al_2O_3$ layer 506 (fabricated by ALD), a p-doped Si substrate 508, and a Cu tape bottom electrode 510. A control device (not shown) has the same configuration except that the PbS layer is removed. Current-voltage measurements were taken in response to 0.01 s voltage transients having several different amplitudes. The shape of these voltage transients is a single-peak triangle wave.

Figure 6A:
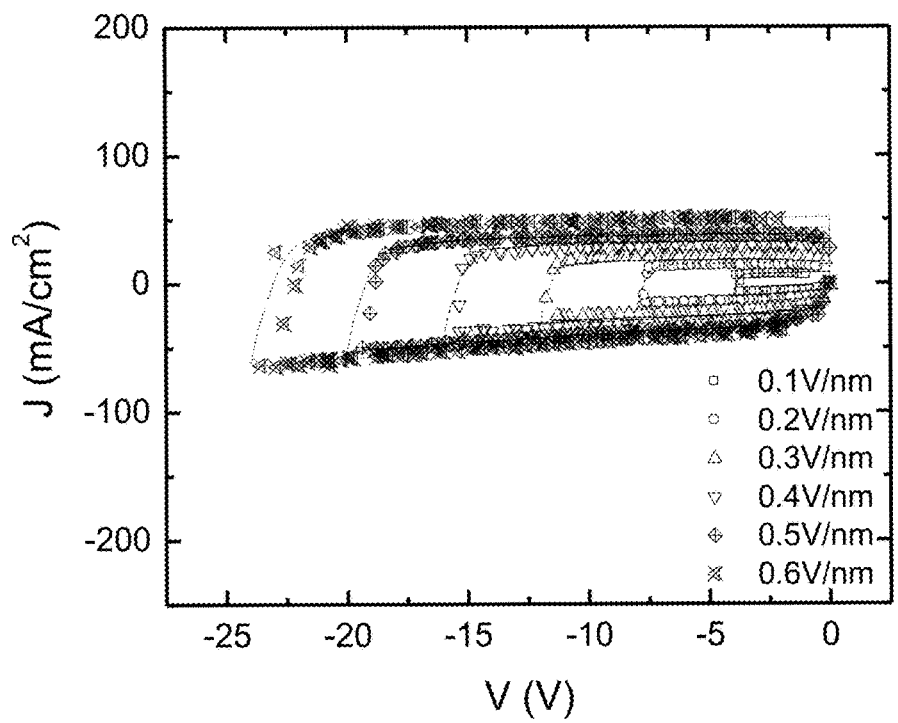
FIG. 6a shows experimental results from a control device.
Figure 6B:
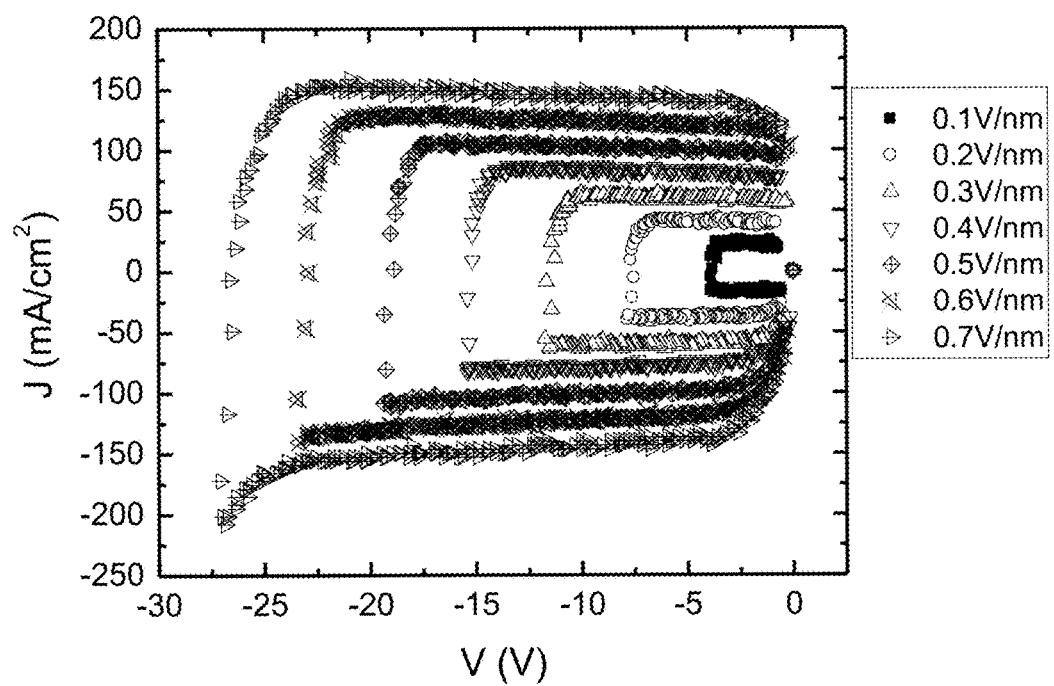
FIG. 6b shows experimental results from a semiconductor energy storage device sample.
Figure 7A:
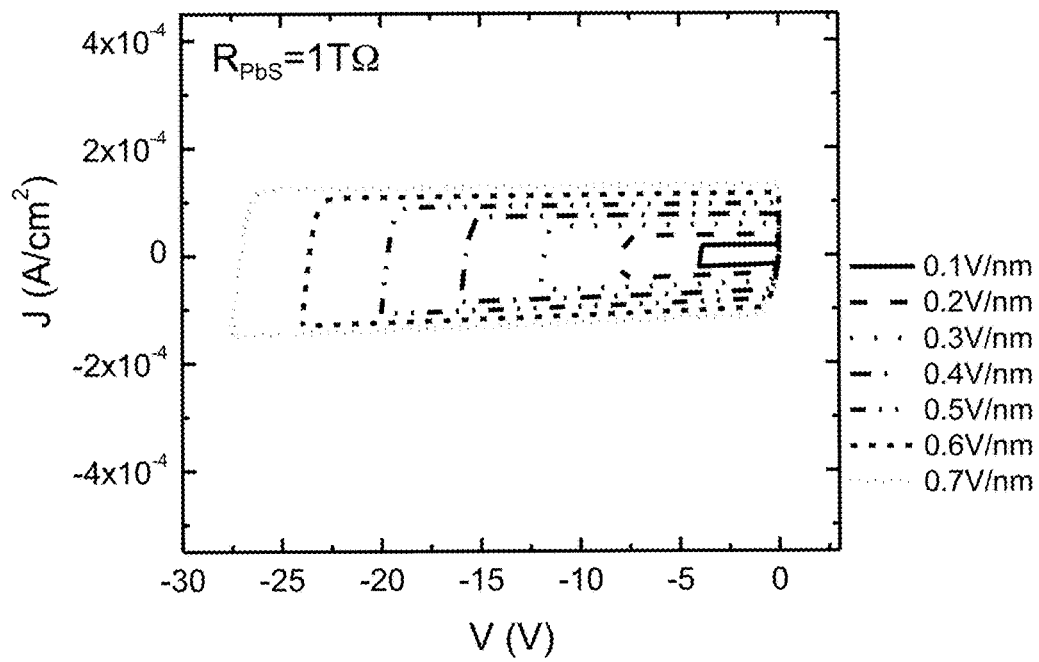
FIGS. 7a-b show simulation results assuming the semiconductor of the example of FIG. 6b acts as an insulator (FIG. 7a) or as a conductor (FIG. 7b).
Figure 7B:
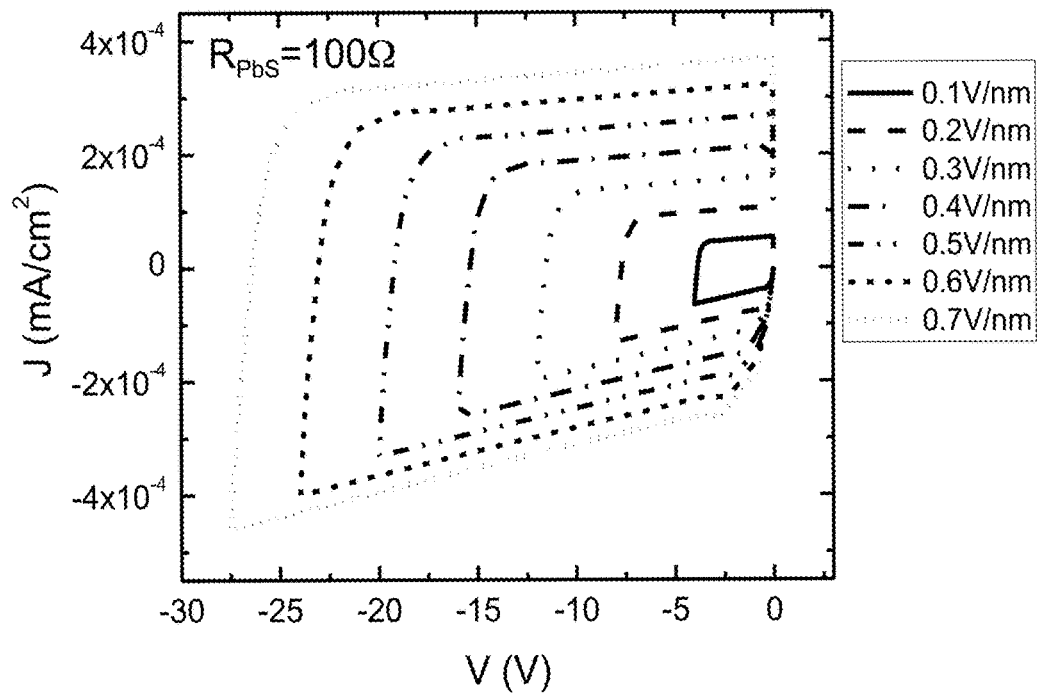

FIG. 6a shows experimental results from the control device. These results are consistent with a simple RC model, as shown by dotted lines generated by an RC model with R and C values consistent with expected values of $Al_2O_3$ (a permittivity of 8.5). FIG. 6b shows experimental results from the sample of FIG. 5. Substantially more current flow (i.e., more charge/energy storage) is seen here than in the control device results of FIG. 6a. FIGS. 7a-b show simulation results assuming the PbS layer of the example of FIG. 5 acts as an insulator (FIG. 7a) or as a conductor (FIG. 7b). In both cases, the simulation results differ from the experimental results by orders of magnitude, which make this a surprising and unexpected result. Apparently, this sample is able to store much more charge/energy than one would expect from simple conventional capacitance models. It is believed that the above-described plasma effect may account for this result. The sample of FIG. 5 demonstrated a discharge energy density of approximately 7 Wh/L and a charge-discharge efficiency above 80%.

B) p-n Junctions for Energy Storage

Figure 8A:
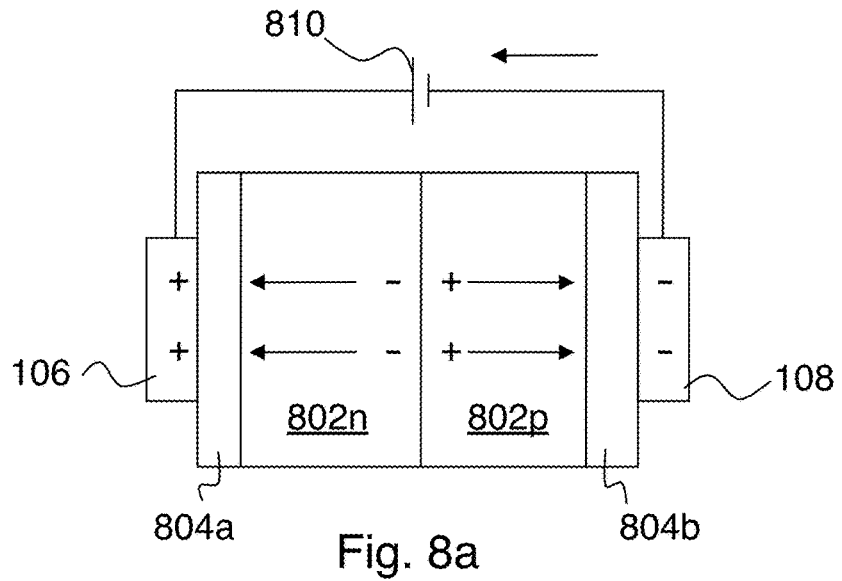
FIGS. 8a-c show operation of a semiconductor p-n junction device for storing energy.
Figure 8B:
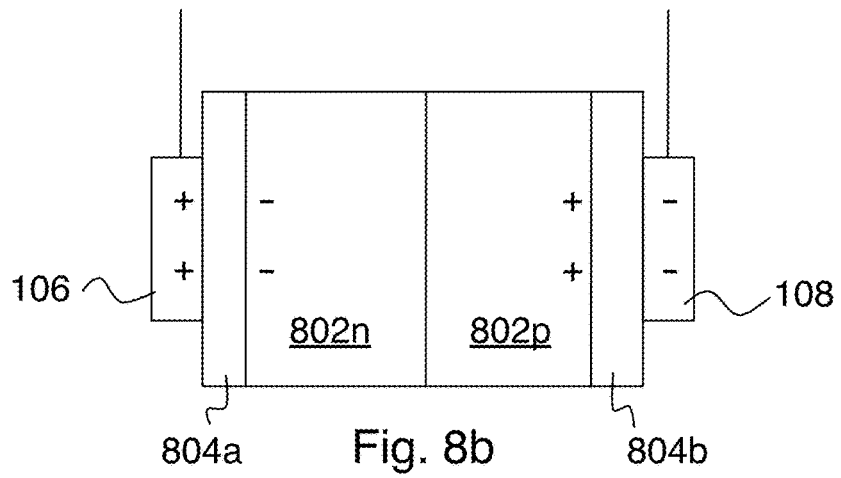
Figure 8C:
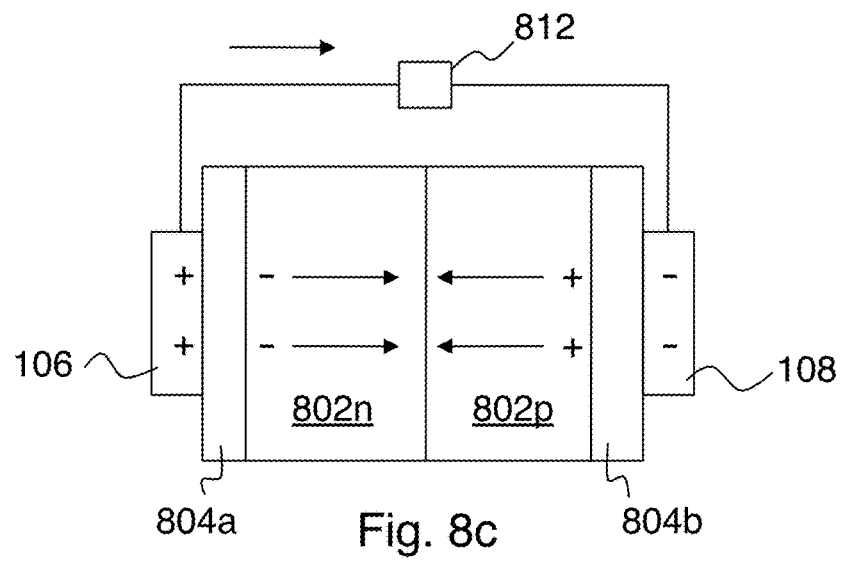

In another aspect of the present approach for providing energy storage, semiconductor p-n junctions can be used for energy storage. FIGS. 8a-c show operation of a semiconductor p-n junction device for storing energy. In this example, an active volume is disposed between conductive electrodes 106 and 108. The active volume has a first region 802n and a second region 802p, where the two regions have differing Fermi levels. Preferably, one of the two regions is doped n-type (802n) and the other is doped p-type (802p). Application of a voltage greater than 5 V across the electrodes produces an energy density of greater than 1 Wh/L in the device. Regions 802n and 802p can be of the same material (homojunction) or of different materials (heterojunction). The active volume is separated from the electrode by barrier volumes 804a and 804b.

FIG. 8a shows charging of the device. A voltage source 810 charges electrodes 106 and 108 as shown. These charges induce a charge separation in the active volume (e.g., electrons in n-type region 802n go left on FIG. 8a, and holes in p-type region 802p go right on FIG. 8a). The resulting configuration of the active volume can have large charge separation over a large distance, which is conducive to high energy storage.

FIG. 8b shows an open-circuit, or disconnected state (i.e., an energy storing state). Because the electrons and holes are at opposite sides of the active volume, this configuration is capable of storing energy for significant lengths of time. The main loss mechanism is expected to be current leakage through barrier volumes 804a and 804b, which can be made low by suitable barrier volume design (e.g., choice of material and barrier volume thickness) according to known principles for selecting good insulators. FIG. 8c shows discharging of the device through a load 812. Charge flow and current flow is reversed relative to the charging configuration of FIG. 8a, so the stored energy is delivered to load 812.

The active volume can include any semiconducting material or materials. Suitable materials include, but are not limited to: Si, Ge, GaAs, InP, InAs, $TiO_2$, ZnO, ZnS, and combinations thereof. Preferably, high doping levels are employed (charge carrier density preferably greater than about $10^{19}$ carriers per $cm^3$, more preferably greater than about $10^{21}$ carrier per $cm^3$). The effective mass of the charge carriers is preferably less than 0.2 $m_e$, where $m_e$ is the electron mass. Preferably, the active volume semiconducting materials have relatively large band gap energy (band gap energy preferably greater than 0.5 eV, more preferably greater than 1.5 eV). In cases where several different materials are employed in the active volume (e.g., a heterostructure), it is preferred for each of the materials to independently have carrier density, effective mass and band gap as described immediately above. In some preferred embodiments, the active volume is planar in shape with all linear dimensions less than about 200 nm.

In the example of FIG. 8a, it is preferred that application of a voltage sufficient to produce an energy density of greater than about 1 Wh/L in the device produces electric fields in breakdown volumes 804a and 804b that are less than the respective breakdown field strengths of the barrier volume materials. Any suitable insulating material can be used for the barrier volume. The barrier volume material preferably has a band gap energy of about 6 eV or more, and preferably has a breakdown field strength of greater than about 0.5 V/nm. Suitable materials include, but are not limited to: $SiO_2$, $Al_2O_3$, $HfO_2$, $Li_2O$, SiON, Zr:$HfO_2$ and fluorides.

Any and all known semiconductor fabrication technology can be employed to fabricate p-n junction based energy storage devices as described herein. For example, layers may be fabricated using thin film deposition techniques such as MBE, PLD, ALD, sputtering, CVD, MOCVD, chemical bath deposition, or a layer transfer process. Doping may be done by ion implantation or from the precursors, targets, or source materials in any of the above approaches. Such fabrication is within the skill of an art worker, and is therefore not described in detail here.

In some embodiments, the device further includes a modifying volume that is disposed proximate to the active volume and which alters a Fermi level of the active volume. When two bodies of different Fermi levels are adjacent, or close enough to establish an equilibrium, electron and/or ion transfer between the two bodies occur to reach electrochemical equilibrium. For example, electrons transfer from a material of low work function to one of high work function to minimize energy, if they are able. The new state thereby established features materials of modified electrochemical potential, or Fermi level. This technique may be applied to modify the electronic structure of layers described in embodiments of the present approach to enhance the energy storage capacity, efficiency, power density, or other features of devices made using the present approach.

Figure 9A:
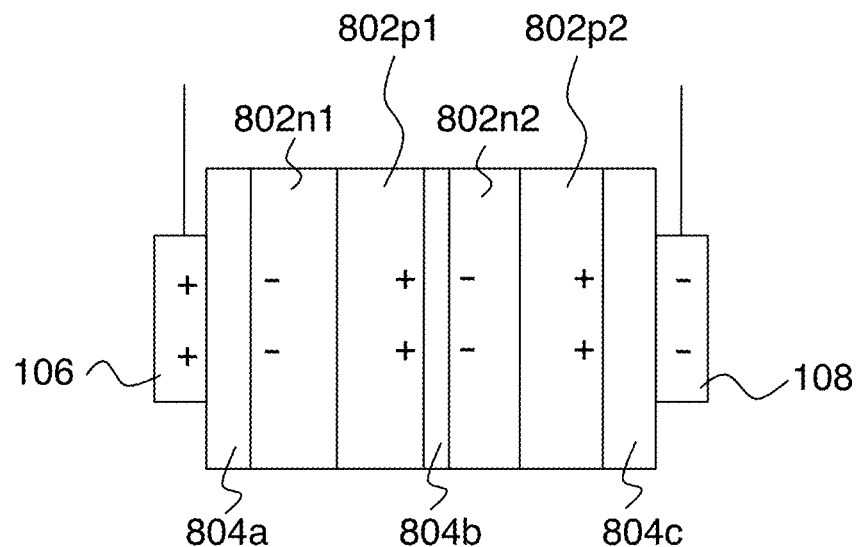
FIGS. 9*a-b* show further examples of semiconductor p-n junction devices for storing energy.
Figure 9B:
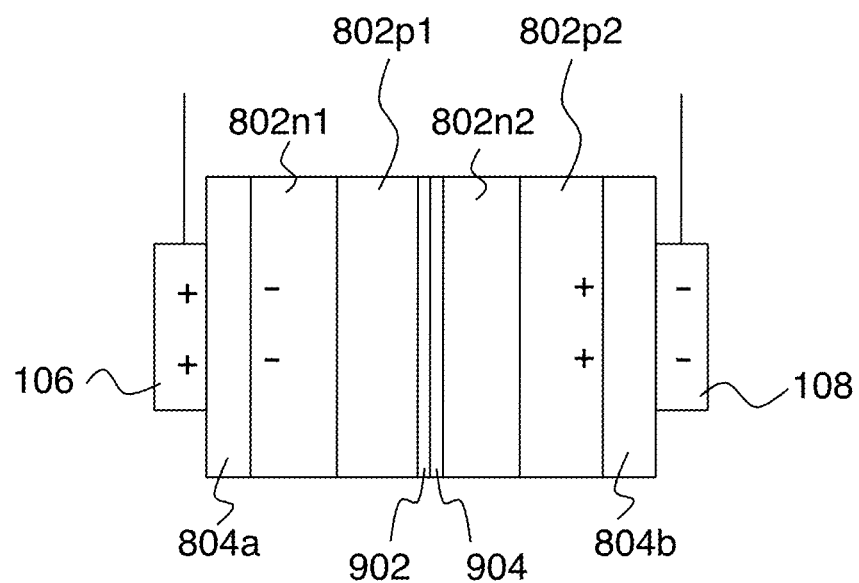

FIGS. 9a-b show further examples of semiconductor p-n junction devices for storing energy. Both of these examples can be regarded as instances of multi-layer device structures. In the example of FIG. 9a, a first active volume (including regions 802n1 and 802p1) and a second active volume (including regions 802n2 and 802p2) are separated by a barrier volume 804b. This sub-assembly is sandwiched between electrodes 106 and 108, and separated from the electrodes by barrier volumes 804a and 804c. The example of FIG. 9b is similar to that of FIG. 9a, except that the central barrier volume 804b is not present. Instead, a tunnel junction is disposed between region 802p1 of the first active volume and region 802n2 of the second active volume. This tunnel junction includes a thin heavily doped p-type layer 902 and a thin heavily doped n-type layer 904. These structures can be repeated any number of times between the electrodes. For example, let E represent an electrode, A represent an active volume, B represent a barrier volume, and T represent a tunnel junction. Then possible structures include but are not limited to: EBABABE, EBATABE, EBABATABE, EBABABABE, etc. An intermediate barrier volume prevents the flow of current, so a charge separation can occur across such a barrier volume, as in the example of FIG. 9a. In contrast, a tunnel junction permits current to flow, so it provides a way to stack up voltage in series without blocking the flow of current. In such multi-layer structures, each of the active volumes may be the same material and/or different materials. Similarly, the compositions of the barrier volumes and tunnel junctions may be the same and/or different.

In the example of FIG. 9a, it is preferred that application of a voltage sufficient to produce an energy density of greater than about 1 Wh/L in the device produces electric fields in barrier volumes 804a, 804b, and 804c that are less than the respective breakdown field strengths of the barrier volume materials. Preferably, the active volumes and barrier volumes in multi-layer structures are as described above in connection with FIGS. 8a-c. Tunnel junctions suitable for making ohmic contact between oppositely doped semiconducting layers are well known in the art (e.g., multi-junction solar cells), and such techniques are applicable here. As described above, excitons may form and possibly condense at intermediate barrier volumes (e.g., 804b on FIG. 9a). Preferably, the separation between the first and second active volumes in the example of FIG. 9a is greater than 5 nm and more preferably greater than about 10 nm. The barrier layer must be thick enough to substantially block current flow, for instance, due to quantum tunneling, which may occur through thin layers.

Figure 10:
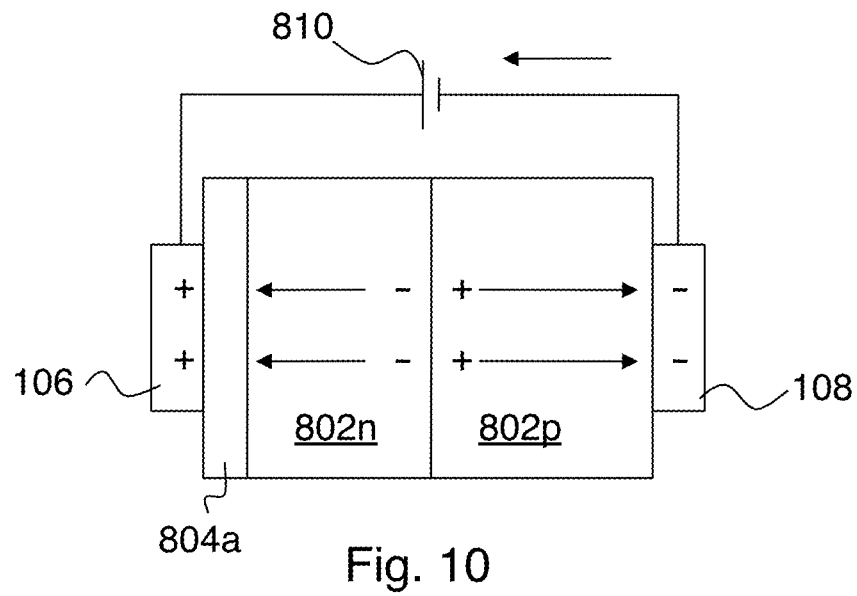
FIG. 10 shows another example of a semiconductor p-n junction device for storing energy.

The preceding description has been by way of example as opposed to limitation. Many variations of the given examples can also be use to practice embodiments of the invention. For example, the p-n junction approach can be practiced with barrier volumes on both sides of the active volume (e.g., as shown on FIG. 8a), or with a barrier volume on one side of the active volume. FIG. 10 shows an example of this configuration, which is like the example of FIG. 8a, except that barrier volume 804b of FIG. 8a is omitted.

Figure 11:
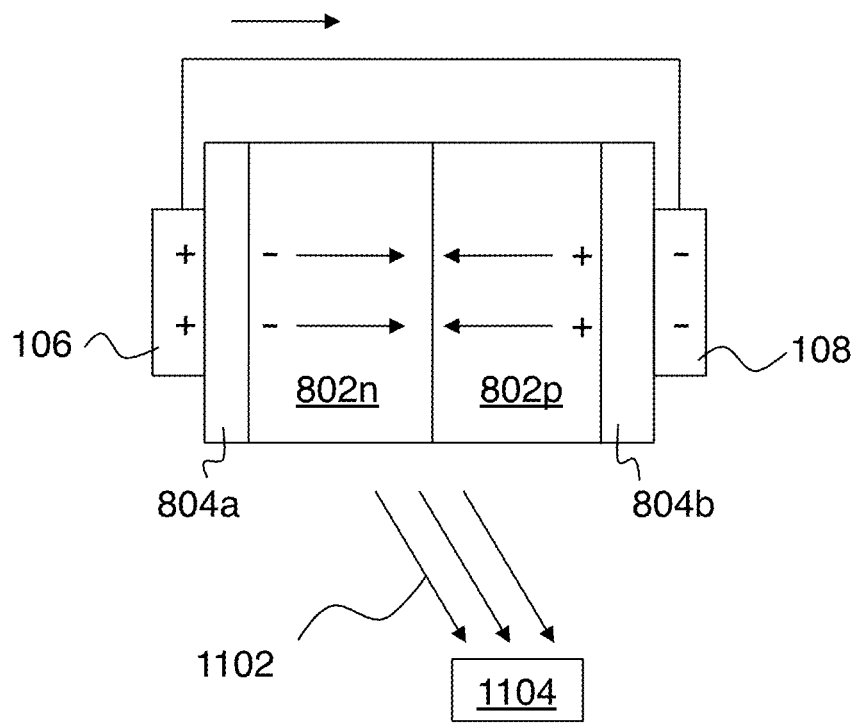
FIG. 11 shows an example of a semiconductor p-n junction device for storing energy where discharged energy is emitted optically.

Another variation relates to how stored energy is released from a p-n junction energy storage device. In the example of FIG. 8c, stored energy is released by flow of electrical current through an electrical load 812. Alternatively and/or in combination, stored energy in such a device can be released by emission of electromagnetic radiation, as in the example of FIG. 11. In this example, discharge of the device entails electron-hole recombination in the junction between regions 802n and 802p, which can lead to emission of electromagnetic radiation 1102. Optionally, a photovoltaic device 1104 can be disposed to receive radiation 1102 and provide electrical power as an output. Use of photovoltaic device 1104 is preferred in cases where the stored energy is to be provided as electrical energy as opposed to radiative energy. Radiation 1102 can be converted to electrical energy by photovoltaic device with high efficiency because radiation 1102 is band gap radiation having a relative small range of wavelengths (e.g., compared to sunlight). Thus, photovoltaic device 1104 is preferably tuned to maximize efficiency for the wavelength band of radiation 1102.

Further variations that may relate to embodiments of the present invention are described in U.S. provisional application 61/506,592, entitled "Solid State Energy Storage Devices", filed on Jul. 11, 2011, and hereby incorporated by reference in its entirety.

The invention claimed is:

1. An energy storage device comprising:
first and second conductive electrodes spaced apart;
a first volume of active material disposed between the electrodes;
a first volume of barrier material disposed between the first electrode and the first volume of active material;
wherein the first volume of active material is a semiconducting material comprising a first region having a first Fermi level and a second region having a second Fermi level different from the first Fermi level; and
wherein application of a voltage of greater than 5 V across the electrodes produces an energy density of greater than about 1 Wh/L in the device.

2. The device of claim 1, further comprising:
a second volume of active material disposed between the second electrode and the first volume of active material.

3. The device of claim 2 further comprising:
a second volume of active material and a third volume of barrier material disposed between the first and second volumes of active material;
wherein the second volume of active material comprises a third region having a third Fermi level and a fourth region having a fourth Fermi level different from the third Fermi level;
wherein the barrier material in the third volume of barrier material has a third breakdown field strength, and
wherein application of the voltage across the electrodes to produce an energy density of greater than about 1 Wh/L in the device produces an electric field in the third volume of barrier material less than the third breakdown field strength.

4. The device of claim 3, wherein the distance between the first and second volumes of active material is greater than about 5 nm.

5. The device of claim 3, wherein the distance between the first and second volumes of active material is greater than about 10 nm.

6. The device of claim 1, further comprising one or more additional volumes of barrier material and one or more additional volumes of active material, wherein the volumes of barrier material and volumes of active material are alternatingly disposed between the electrodes, and wherein each additional volume of active material has two regions having differing Fermi level.

7. The device of claim 1, further comprising one or more additional volumes of active material and one or more tunnel junctions, wherein each additional volume of active material has two regions having differing Fermi level, and wherein the volumes of active material and the tunnel junctions are alternatingly disposed between the electrodes.

8. The device of claim 1, wherein the device is configured to release stored energy by emission of electromagnetic radiation.

9. The device of claim 1, wherein the device is configured to release stored energy by flow of electrical current through an electrical load.

* * * * *